US008970445B2

(12) United States Patent
Mitomo et al.

(10) Patent No.: US 8,970,445 B2
(45) Date of Patent: Mar. 3, 2015

(54) RADIO DEVICE

(75) Inventors: Toshiya Mitomo, Kawasaki (JP); Yukako Tsutsumi, Kawasaki (JP); Hideo Kasami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 13/398,098

(22) Filed: Feb. 16, 2012

(65) Prior Publication Data

US 2012/0235878 A1 Sep. 20, 2012

(30) Foreign Application Priority Data

Mar. 16, 2011 (JP) ................................ 2011-058342

(51) Int. Cl.

| | |
|---|---|
| ***H01Q 1/50*** | (2006.01) |
| ***H03H 7/38*** | (2006.01) |
| ***H04B 1/46*** | (2006.01) |
| ***H01Q 3/00*** | (2006.01) |
| ***H01Q 7/00*** | (2006.01) |
| ***H01Q 9/16*** | (2006.01) |

(52) U.S. Cl.

CPC . *H01Q 1/50* (2013.01); *H01Q 3/00* (2013.01); *H01Q 7/00* (2013.01); *H01Q 9/16* (2013.01)

USPC ................ 343/860; 343/861; 333/32; 455/82

(58) Field of Classification Search

CPC ................................ H01Q 7/00; H01Q 7/005

USPC ................................ 343/860, 861, 745, 855

See application file for complete search history.

(56) References Cited

U.S. PATENT DOCUMENTS

| | | | | |
|---|---|---|---|---|
| 2008/0079650 A1* | 4/2008 | Constantinidis et al. | ..... | 343/858 |
| 2008/0233906 A1* | 9/2008 | Mitomo et al. | ............... | 455/131 |
| 2010/0045402 A1* | 2/2010 | Johansson | ....................... | 333/32 |
| 2011/0057744 A1* | 3/2011 | McKay et al. | ................. | 333/26 |

(Continued)

FOREIGN PATENT DOCUMENTS

| | | |
|---|---|---|
| JP | 06-303021 A | 10/1994 |
| JP | 2005-223742 A | 8/2005 |

(Continued)

OTHER PUBLICATIONS

Japanese Office Action dated Jul. 13, 2012 and English translation thereof in counterpart Japanese Application No. 2011-058342.

*Primary Examiner* — Dameon E Levi
*Assistant Examiner* — Ricardo Magallanes
(74) *Attorney, Agent, or Firm* — Holtz, Holtz, Goodman & Chick PC

(57) ABSTRACT

There is provided a radio device including an antenna, a first impedance converting circuit, a second impedance converting circuit and a differential output unit. The antenna has a first terminal and a second terminal to receive a signal. The first impedance converting circuit and the second impedance converting circuit have a first impedance and a second impedance, respectively. The first impedance and the second impedance each are controllable. One end of the first impedance converting circuit and one end of the second impedance converting circuit are connected to the first terminal and the second terminal of the antenna, respectively. The differential output unit is connected to the other end of the first impedance converting circuit and the other end of the second impedance converting circuit through which the signal received by the antenna is input to the differential output unit, and transform the signal into a differential signal.

2 Claims, 8 Drawing Sheets

(56) References Cited

U.S. PATENT DOCUMENTS

2012/0142286 A1* 6/2012 Mitomo et al. ................. 455/82
2013/0214981 A1* 8/2013 Tsutsumi et al. ............. 343/771

FOREIGN PATENT DOCUMENTS

JP 2008-294748 A 12/2008
JP 2009-218872 A 9/2009

* cited by examiner

RADIO DEVICE

CROSS REFERENCE TO RELATED APPLICATIONS

This application is based upon and claims the benefit of priority from the prior Japanese Patent Application No. 2011-058342, filed on Mar. 16, 2011, the entire contents of which are incorporated herein by reference.

FIELD

Embodiments of the present invention relate to a radio device, for example, to a radio transceiver with a differential balanced antenna.

BACKGROUND

Conventionally, there has been proposed an antenna device in which two antennas are connected to a switching device, respectively, and one of two signals of the two antennas can be input to a receiver through selection by the switching device.

This antenna device can change a radiation pattern by selecting the antennas, providing a diversity effect. However, providing the diversity effect involves a plurality of antennas and receivers, resulting in an increase in a mounting area and a higher mounting cost.

Also, according to another conventional art, a known antenna device has a loop antenna both ends of which are short-circuited each other so as to change a radiation pattern. In this case, a single antenna can allow the pattern to be changed. However, since each terminal of the antenna is short-circuited, there arises a problem that a signal cannot be input or output when a transceiver to process a differential signal is connected to the antenna device. It is noted that because a differential signal, generally, can drastically reduce performance degradation caused from external noises and hard-wiring connected to a radio device, it is said that the differential signal can present a considerably workable improvement in performance of a radio device configured to process a high frequency.

As described above, there have conventionally been problems, such as an increase in the mounting area, a higher cost or a lack of connection capability to a differential transceiver.

DETAILED DESCRIPTION

According to an embodiment, there is provided a radio device including an antenna, a first impedance converting circuit, a second impedance converting circuit and a differential output unit.

The antenna has a first terminal and a second terminal to receive a signal.

The first impedance converting circuit and the second impedance converting circuit have a first impedance and a second impedance, respectively. The first impedance and the second impedance each are controllable. One end of the first impedance converting circuit and one end of the second impedance converting circuit are connected to the first terminal and the second terminal of the antenna, respectively.

The differential output unit is connected to the other end of the first impedance converting circuit and the other end of the second impedance converting circuit through which the signal received by the antenna is input to the differential output unit, and transform the signal into a differential signal.

Hereinafter, embodiments according to the present invention will be described below with reference to the drawings.

(First Embodiment)

Figure 1:
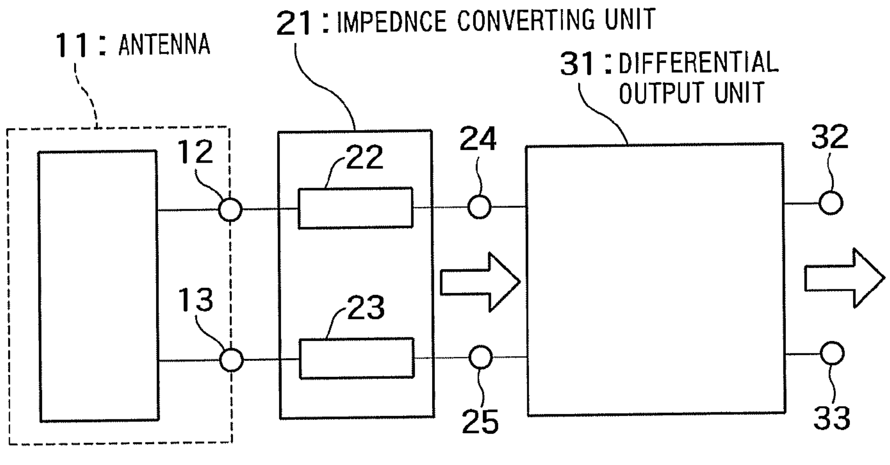
FIG. 1 shows a radio device according to a first embodiment.

FIG. 1 shows a configuration of a radio device according to a first embodiment.

This radio device is constructed as a receiver including an antenna 11, an impedance converting unit 21, and a differential output unit 31.

The antenna 11 is a differential input and output antenna including two terminals 12, 13 as a first and second terminal, respectively. The antenna including two antennas described above is, for example, a loop antenna or a dipole antenna. At these two terminals 12, 13, a differential signal is input and output. The antenna, in receiving operation, outputs an analog signal at these terminals 12, 13, the analog signal originating from a radio signal incoming from the air.

The impedance converting unit 21 includes two impedance converting circuits 22, 23 (a first and second impedance converting circuit). Each one end of the impedance converting circuits 22, 23 is connected to the terminals 12, 13, respectively.

The impedance converting circuits 22, 23 have a first impedance and a second impedance, each being controllable. Each of the impedance converting circuits can switch, for example, between a low impedance state and a high impedance state (for example, infinite). Accordingly, an impedance with respect to each of the antenna terminals 12, 13 can take a different value, and a combination of the impedances with respect to the antenna terminals 12, 13 can change a radiation pattern of the antenna, providing the antenna diversity effect.

When impedances of the impedance converting circuits 22, 23 are equal to one another (in the case that the impedances are both low), then, signals at the terminals 12, 13 of the antenna 11 pass through the impedance converting circuits 22, 23 under the equal condition, and a differential signal, accordingly, is output at terminals 24, 25 corresponding to the other end of the impedance converting circuit 22 and the other end of the impedance converting circuit 23, respectively.

On the other hand, when the impedances of the impedance converting circuits 22, 23 are not equal to one another, an unbalanced signal (single ended signal) is output at the terminals 24, 25. For example, when the impedance of the impedance converting circuit 22 is low and the impedance of the impedance converting circuit 23 is infinite, the output signal at the terminal 12 is output at the terminal 24, and the terminal 25 is grounded.

The differential output unit 31 receives the signal at the terminals 24, 25.

The differential output unit 31 provides the signal (differential signal) received at the terminals 24, 25 to output terminals 32, 33 when the impedances of the impedance converting circuits 22, 23 are equal to one another (in the case that the impedances are low). In doing so, the differential output unit 31 may amplify the differential signal or convert its frequency before outputting. The output terminals 32, 33 output the provided signal to a circuit in a subsequent stage (not shown).

On the one hand, when the impedances of the impedance converting circuits 22, 23 are not equal to one another, the differential output unit 31 transforms the signal (unbalanced signal) received at the terminals 24, 25 into a differential signal and provides the transformed signal to the output terminals 32, 33. In doing so, the differential output unit 31 may amplify the differential signal or convert its frequency.

In this manner, the output signal from the differential output unit 31 is consistently in the form of differential signal whether the input signal to the differential output unit 31 is in the form of differential signal or in the form of unbalanced signal, furthermore both cases are possible.

The configuration described above can provide a radio device with the diversity function using a single antenna, and allow a signal received by an antenna to be output in the form of differential signal.

An example of a specific configuration of the radio device shown in FIG. 1 will be described below.

Figure 2:
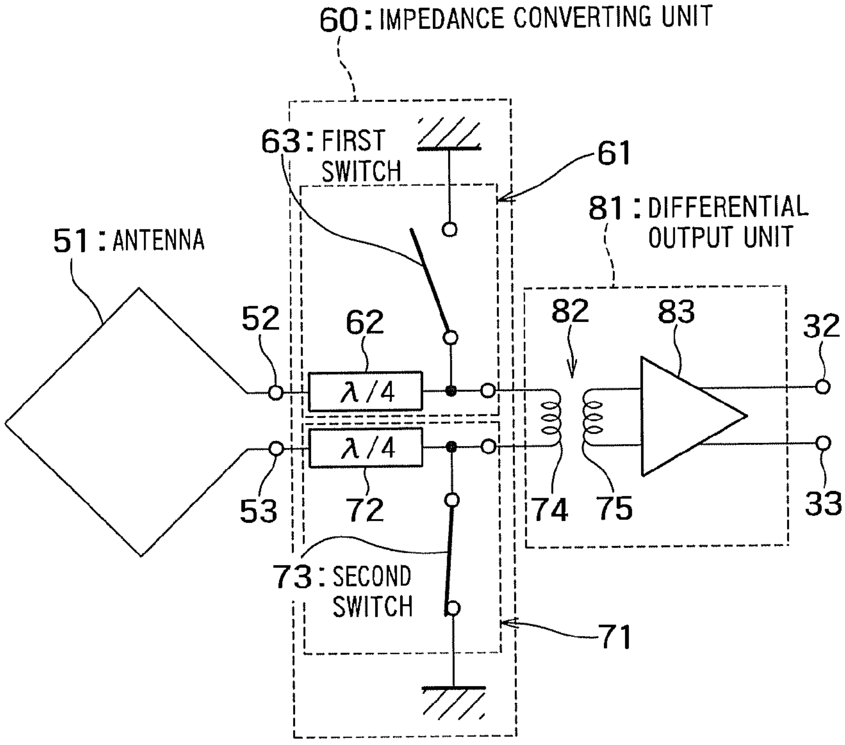
FIG. 2 shows an example of a first configuration of the radio device.

FIG. 2 shows an example of a first configuration of the radio device.

A loop antenna 51 is used as a differential input and output antenna.

An impedance converting unit 60 includes a first impedance converting circuit 61 and a second impedance converting circuit 71.

The first impedance converting circuit 61 includes a quarter-wave line (λ/4 line) 62 and a first switch 63. The quarter-wave line is a transmission line having the equivalent electrical length of a quarter wavelength of a signal frequency. An input portion of the quarter-wave line 62 is connected to a terminal 52 of the antenna 51. An output portion of the quarter-wave line 62 is connected to one end of the first switch 63. The other end of the first switch 63 is connected to a high-frequency grounding point (ground).

The second impedance converting circuit 71 includes a quarter-wave line (λ/4 line) 72 and a second switch 73. The quarter-wave line is a transmission line having the equivalent electrical length of a quarter wavelength of a signal frequency. An input portion of the quarter-wave line 72 is connected to a terminal 53 of the antenna 51. An output portion of the quarter-wave line 72 is connected to one end of the second switch 73. The other end of the second switch 73 is connected to a high-frequency grounding point (ground).

A differential output unit 81 includes a balun (transformer) 82 and a differential amplifier 83. The balun can be constructed by using a coupling coil or a coupled line. The illustrated example shows an example in which a coupling coil is used. The balun 82 includes a coil 74 with two terminals on the input side and a coil 75 with two terminals on the output side. The coils 74, 75 are disposed so that they can be coupled to one another. The two terminals on the input side are connected to one end of the first switch 63 and one end of the second switch 73, respectively. A signal received at the two terminals on the input side is coupled to the two terminals on the output side through coil coupling. In doing so, when the signal received at the two terminals on the input side is a differential signal, the balun 82 couples the signal directly in the form of differential signal to the output terminals. When the signal is an unbalanced signal (in this example, a single ended signal), the balun 82 operates so that the signal is transformed into a differential signal and coupled to the output terminals.

Figure 3:
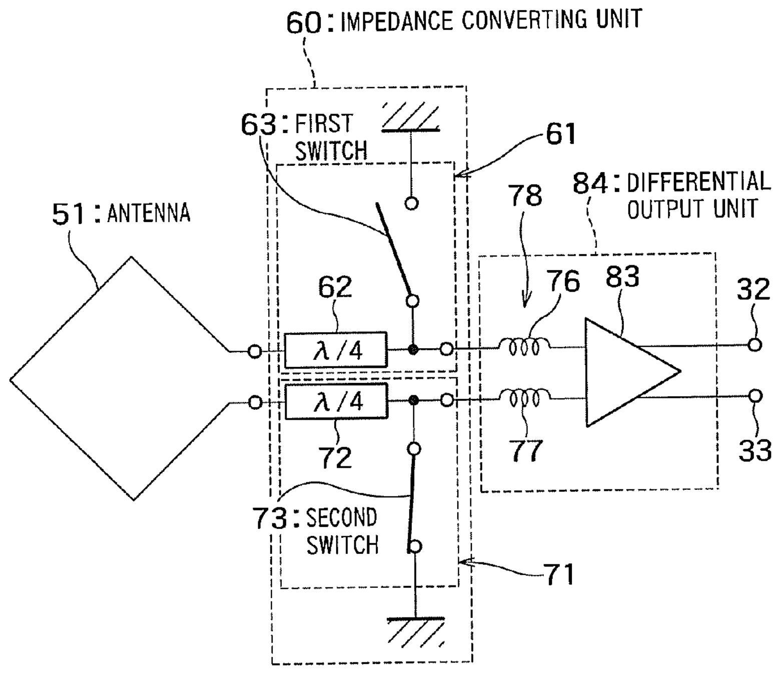
FIG. 3 shows an example of another configuration of a balun.
Figure 15:
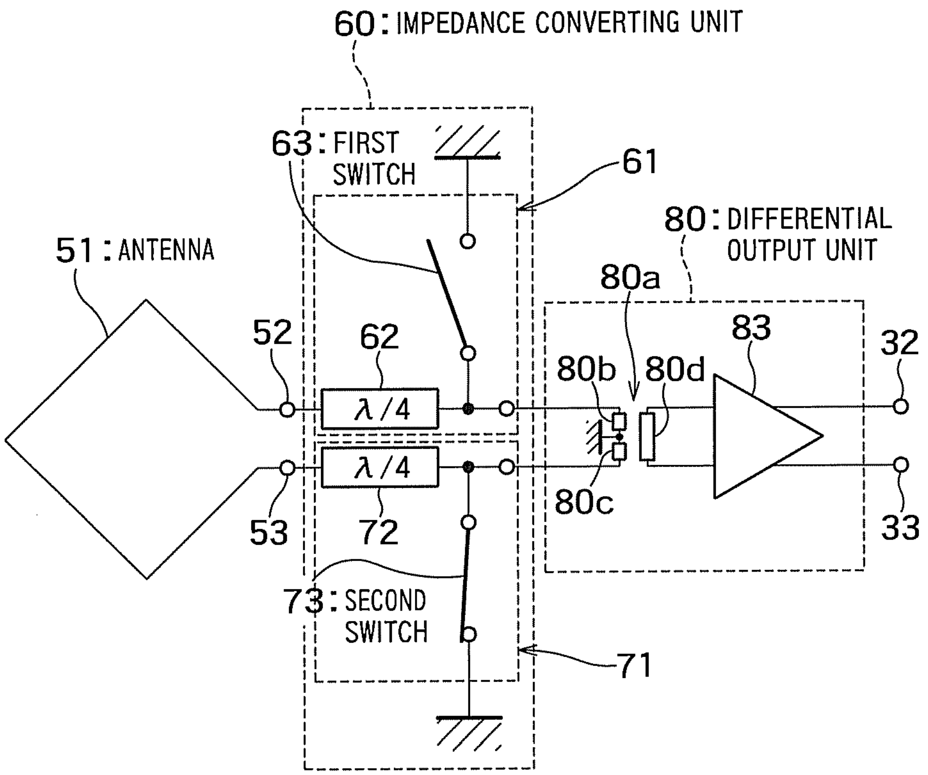
FIG. 15 shows an example of a configuration of a balun formed of a coupled line.

A configuration shown in FIG. 3 may be used for an example of another configuration of the balun with a coupling coil. The balun 78 is disposed in a differential output unit 84. Coils 76, 77 are disposed so that they can be coupled to one another. One terminal of the coil 76 and one terminal of the coil 77, as terminals on the input side, respectively, are connected to one end of the switch 63 and one end of the switch 73, respectively. Further, the other terminal of the coil 76 and the other terminal of the coil 77, as terminals on the output side, respectively, are connected to differential input terminals of the amplifier 83, respectively. Also, a configuration shown in FIG. 15 may be used for an example of a configuration of the balun with a coupled line. In a differential output unit 80, coupled lines 80*b*, 80*c* are disposed so that they can be coupled to a coupled line 80*d*, resulting in a balun 80*a*.

The differential amplifier 83 amplifies a signal provided by the balun 82, i.e. a differential signal, and outputs it at output terminals 32, 33.

An example of operation of the radio device shown in FIG. 2 will be described.

The antenna 51 outputs an incoming signal to the impedance converting circuits 61, 71 in the impedance converting unit 60 via the two terminals. The signal to be output is a differential signal.

Suppose that the first switch 63 and the second switch 73 in the impedance converting unit 60 are both open. Then, an input differential signal is directly sent through the balun 82 to the differential amplifier 83, and amplified to be output.

Figure 4:
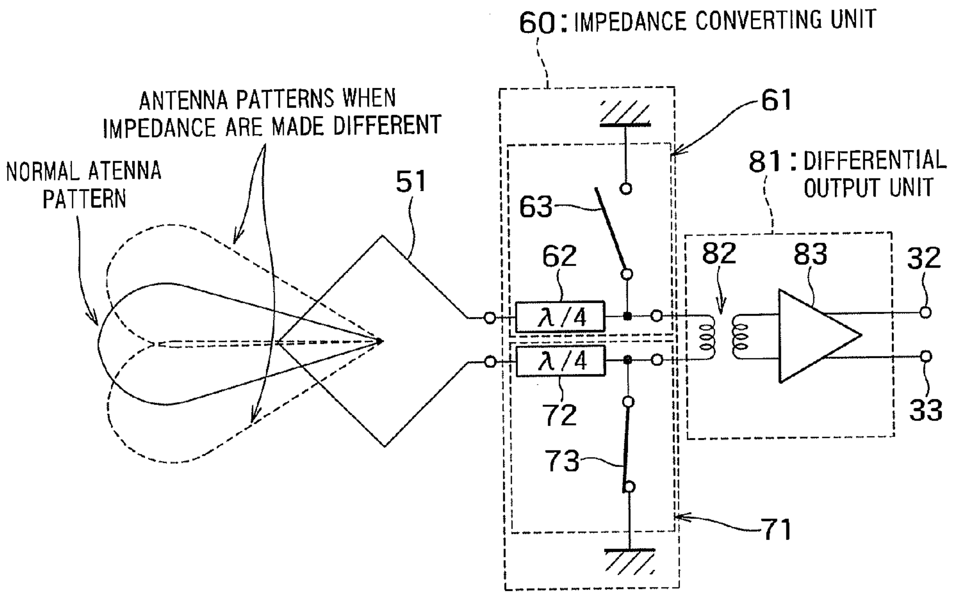
FIG. 4 shows a manner in which a radiation pattern is changed.

On the one hand, suppose that one of the first switch 63 and the second switch 73 in the impedance converting unit 60 is short-circuited. Then, an impedance of the switch in a short-circuited state as seen from the antenna 51 corresponds to an impedance of a circuit in which a quarter-wave line is short-circuited, and accordingly the impedance becomes very high. In this manner, a terminal condition under which one of the two terminals of the antenna is differs from a terminal condition of the other of the two terminals, and accordingly a radiation pattern can be changed, allowing the diversity effect to be provided. That is, by turning one of the two switches on, or turning both the switches off, a radiation pattern can be changed, as shown in FIG. 4.

When one of the two switches is turned on, a signal output by the impedance converting unit 60 is an unbalanced signal in which one output of the two impedance converting circuits 61, 71 is at a high-frequency grounding point potential (ground potential).

When the unbalanced signal as described above is input, the balun 82 in the differential output unit 81 transforms this unbalanced signal into a differential signal. Accordingly, the differential input and output amplifier 83 is provided with the differential signal similarly to the case where the switches are both open, and the differential input and output amplifier 83 can provide an amplified differential signal.

As described above, according to the example of the first configuration, a single antenna element can provide the diversity function, and also a differential signal can be output from the differential output unit.

Figure 5:
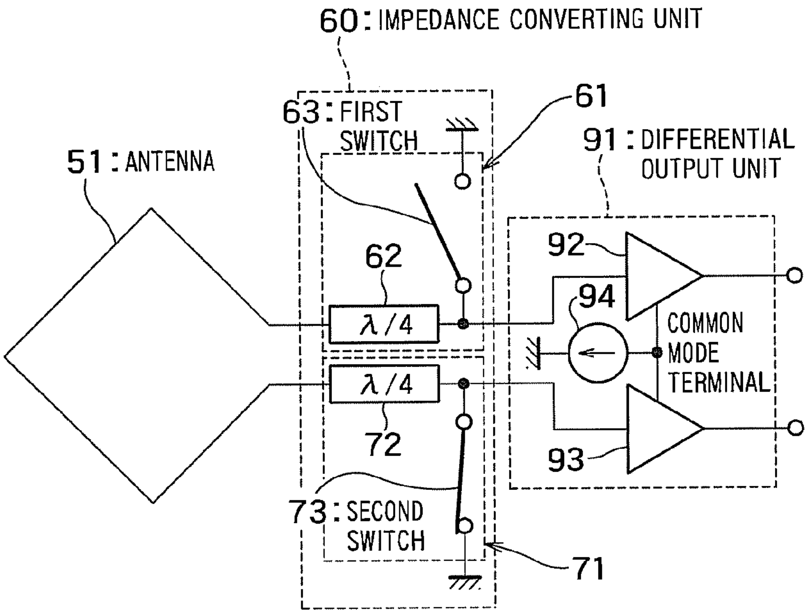
FIG. 5 shows an example of a second configuration of the radio device.

FIG. 5 shows an example of a second configuration of the radio device.

This example differs from the example of the first configuration shown in FIG. 2 in a differential output unit 91. Parts similar to those of the example of the first configuration have like reference numbers and description about them will be omitted. The differential output unit 91 will be described below with a focus on it.

The differential output unit 91 includes an amplifier of differential-pair type having single ended input and output amplifiers 92, 93 and a current source 94. Output portions of impedance converting circuits 61, 71 are connected to input portions of the two single ended input and output amplifiers 92, 93. Common mode terminals of the amplifiers 92, 93 are both connected to the single current source 94. It is noted that this current source 94 may include an active element such as a transistor, or include a resistor and/or an inductor.

When a first and second switch 63, 73 are both open, then, similarly to the example of the first configuration, a differential signal is input to the differential output unit 91 by an impedance converting unit 60, and this differential signal is amplified by the amplifier of differential-pair type (92, 93, 94) to be output.

On the one hand, when one of the first switch 63 and the second switch 73 is short-circuited, then, similarly to the example of the first configuration, the impedance converting unit 60 provides an unbalanced signal in which one output of the two impedance converting unit 60 is at a high-frequency grounding point potential. Accordingly, the impedance converting circuit whose switch is open outputs a signal having a large amplitude, and the impedance converting circuit whose switch is short-circuited outputs a signal having a very small amplitude (for example, the amplitude is substantially equal to zero).

In the amplifier of differential-pair type (92, 93, 94) in the differential output unit 91, from the common mode terminal of one of the single ended amplifiers, a current signal is sent to the other single ended amplifier. Accordingly, the single ended amplifier receiving the signal of a large amplitude provides the single ended amplifier receiving the signal of a very small amplitude with a difference signal via the common mode terminal, thus allowing a differential signal having the same amplitude (amplified differential signal) to be output at output terminals of the differential output unit 91.

As described above, also according to the example of the second configuration, a single antenna element can provide the diversity function, and also a differential signal can be output from the differential output unit.

Figure 6:
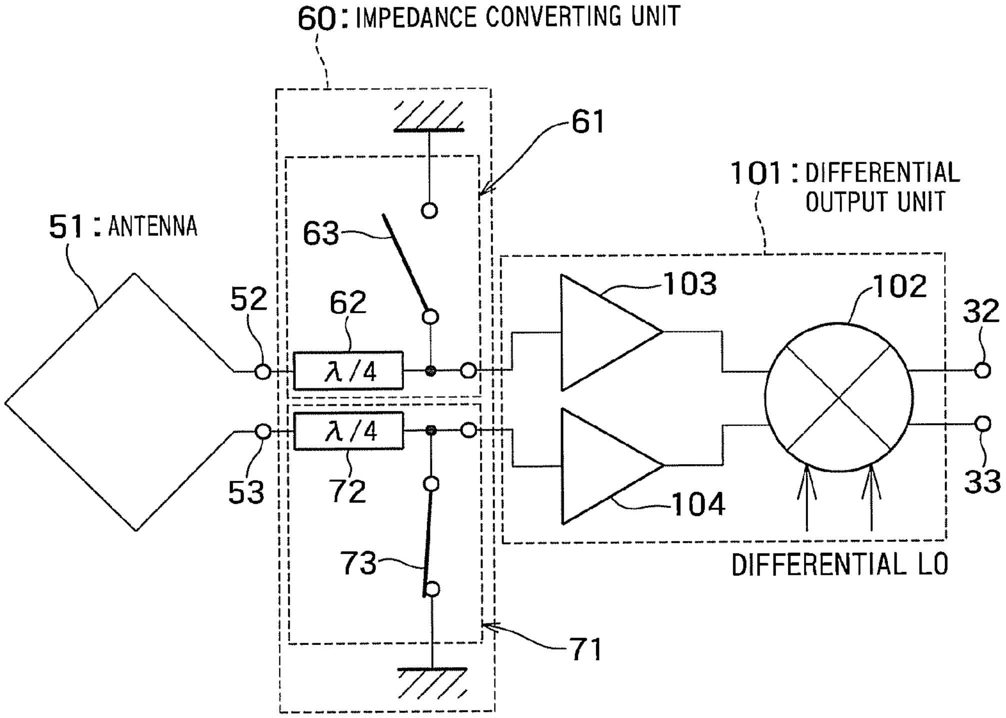
FIG. 6 shows an example of a third configuration of the radio device.

FIG. 6 shows an example of a third configuration of the radio device.

This example differs from the examples of the first and second configuration shown in FIG. 2 in a differential output unit 101. Parts similar to those of the examples of the first and second configuration have like reference numbers, and description about them will be omitted. The differential output unit 101 will be described below with a focus on it.

The differential output unit 101 includes amplifiers 103, 104 and a frequency converter of balance type 102.

Output portions of impedance converting circuits 61, 71 are connected to input portions of two single ended input and output amplifiers 103, 104, respectively. Output portions of the amplifiers 103, 104 are connected to an input portion of the balance type frequency converter 102 which uses a differential local signal (differential LO signal).

When a first and second switch 63, 73 are both open, then, a differential signal is input to the amplifiers 103, 104 by an impedance converting unit 60. The input differential signal is amplified by the amplifiers 103, 104 and is subsequently frequency-converted to be output by the balance type frequency converter 102.

On the one hand, when one of the first switch 63 and the second switch 73 is short-circuited, then, similarly to the example of the first configuration, in the impedance converting unit 60, one output of the two impedance converting circuits 61, 71 is an unbalanced signal at a high-frequency grounding point potential. Accordingly, output signals of the two single ended amplifiers 103, 104 are also unbalanced signals, but a frequency-converted differential signal can be output by the balance type frequency-converter 102 using the differential LO signal.

As described above, also according to the example of the third configuration, a single antenna element can provide the diversity function, and also a differential signal can be output from the differential output unit.

Figure 7:
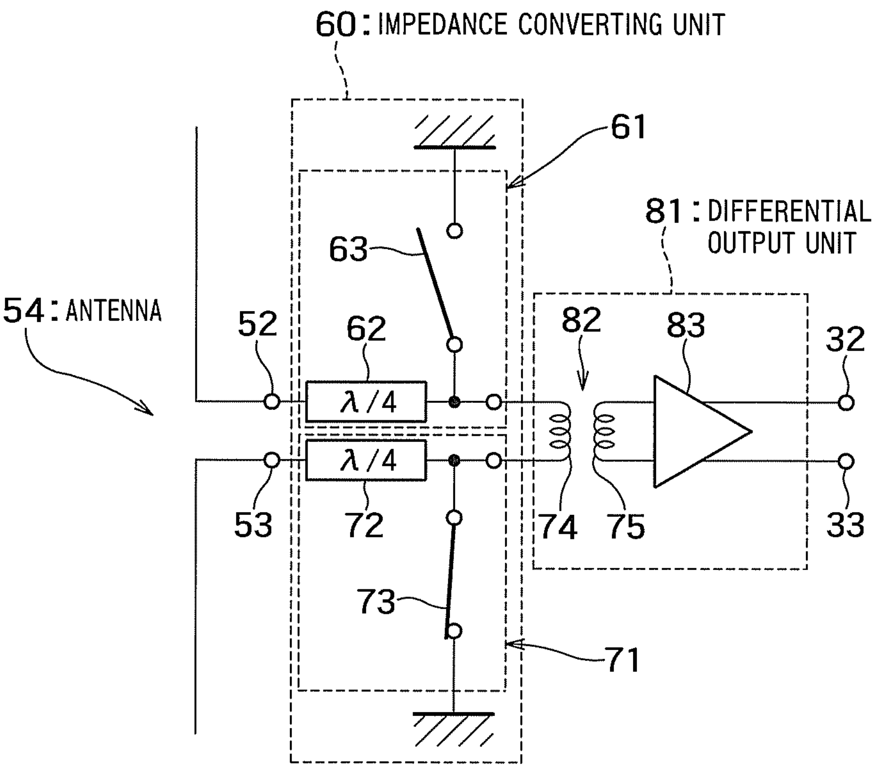
FIG. 7 shows an example of a fourth configuration of the radio device.

FIG. 7 shows an example of a fourth configuration of the radio device.

This example differs from the example of the first configuration in that the loop antenna is replaced by a dipole antenna 54. A further point is similar to the example of the first configuration, and description thereof will be omitted.

As described above, also according to the example of the fourth configuration, a single antenna element can provide the diversity function, and also a differential signal can be output from the differential output unit.

(Second Embodiment)

The first embodiment has described the configurations of a receiver as a radio device. In this embodiment, configurations of a transmitter will be described.

Figure 8:
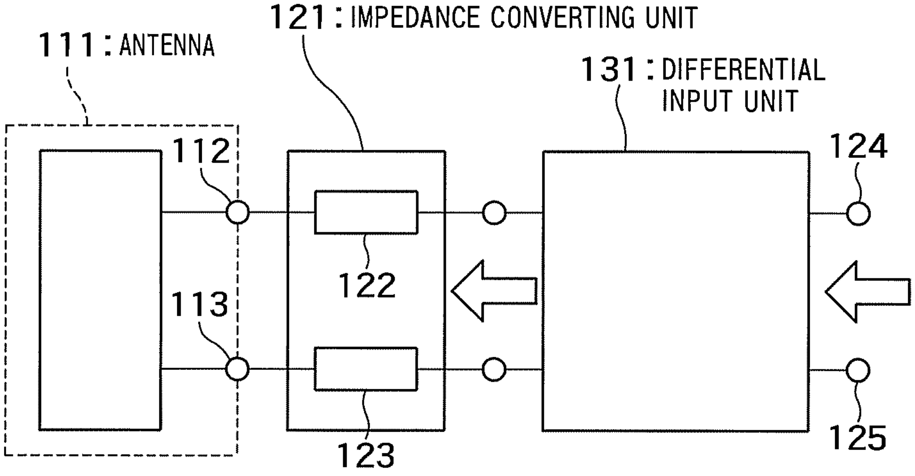
FIG. 8 shows a radio device according to a second embodiment.

FIG. 8 shows a configuration of a radio device according to a second embodiment.

This radio device is a transmitter including an antenna 111, an impedance converting unit 121 and a differential input unit 131.

The antenna 111 includes two terminals 112, 113. The antenna 111, in transmission operation, radiates an analog transmission signal received at the two terminals 112, 113 in the air as a radio signal.

The impedance converting unit 121 includes two impedance converting circuits 122, 123 (a first and second impedance converting circuit). Output portions of the impedance converting circuits 122, 123 are connected to the terminals 112, 113 of the antenna 111, respectively.

The impedance converting circuits 122, 123 include a first impedance and a second impedance, each being controllable. A configuration of the impedance converting circuits 122, 123 is similar to that of the first embodiment. That is, each of the impedance converting circuits 122, 123 can be switched into, for example, a low impedance state or a high impedance state (for example, an infinite impedance state), and take a variable value of their impedance with respect to the terminals 112, 123. Thus, an antenna radiation pattern can be changed, providing the antenna diversity.

The differential input unit 131 receives a differential signal at the terminals 124, 125 as a transmission signal. The differential input unit 131 transforms the transmission signal into an unbalanced signal corresponding to the difference between the impedances of the impedance converting circuits 122, 123. When both impedances are equal to one another, the transformed signal is also a differential signal.

The transformed signal is provided to input portions of the impedance converting circuits 122, 123. In particular, when the impedances of the impedance converting circuits 122, 123 are equal to one another (in the case where the impedances are low), the input differential signal is provided to the input portions of the impedance converting circuits 122, 123. In doing so, the differential input unit 131 may output after processing amplification of the differential signal or frequency conversion. The differential signal input to the impedance converting circuits 122, 123 is input to the antenna 111 and radiated in the air as radio waves.

On the one hand, in the differential input unit 131, when the impedances of the impedance converting circuits 122, 123 are not equal to one another, then, one of the output portions of the differential input unit 131 is in a low impedance state and the other output portion is in a high impedance state, and the differential input unit 131, accordingly, outputs an unbalanced signal.

For example, when the impedance converting circuit 122 is in a low impedance state and the impedance converting circuit 123 is in a high impedance state, then, a signal of a large amplitude passes through the impedance converting circuit 122, and is input to the terminal 112 of the antenna, and a signal of a small amplitude (for example, substantially equal to zero) is input to the terminal 113 of the antenna through the impedance converting circuit 123. That is, an unbalanced signal is input to the terminals 112, 113 of the antenna 111. The input unbalanced signal is radiated in the air as radio waves. The direction of radiation is different from the direction when the impedance converting circuits 122, 123 are both in a low impedance state. Thus, also in the case of transmission, a single antenna element can provide the diversity function even though the input signal is a differential signal.

It is noted that when the differential input unit 131 outputs the unbalanced signal, the unit 131 may output after processing amplification of the differential signal or frequency conversion.

Figure 9:
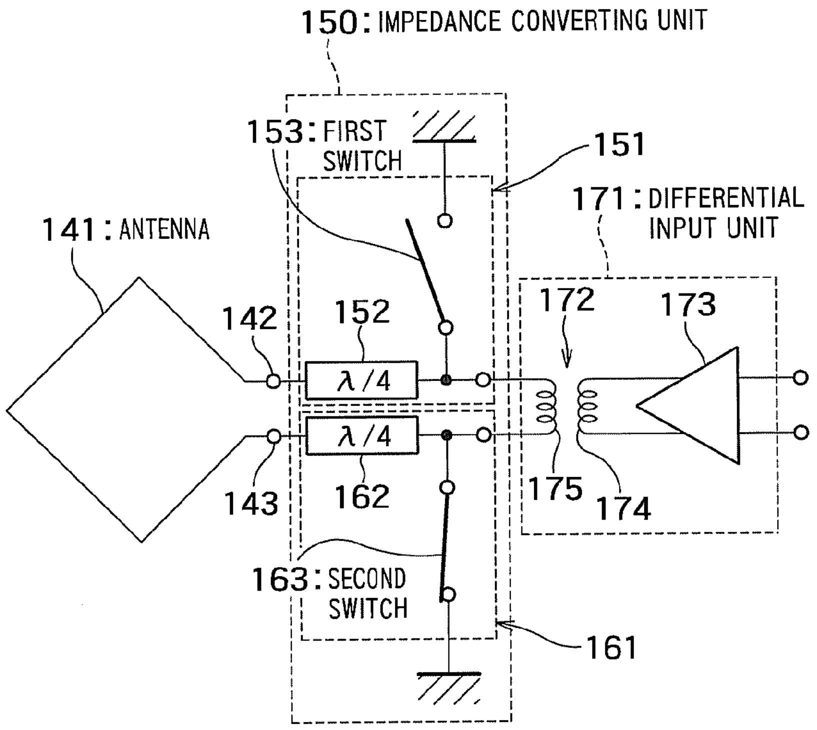
FIG. 9 shows an example of a configuration of the radio device according to the second embodiment.

FIG. 9 shows an example of a configuration of the radio device according to the second embodiment.

The configuration of FIG. 9 corresponds to a configuration created by modifying, for a transmitter, the example of the configuration according to the first embodiment shown in FIG. 2.

For an antenna, a loop antenna 141 is used. Also, a dipole antenna may be used.

A first impedance converting circuit 151 includes a quarter-wave line (λ/4 line) 152 and a first switch 153. The quarter-wave line 152 is a transmission line having the equivalent electrical length of a quarter wavelength of a signal frequency. One end of the quarter-wave line 152 is connected to a terminal 142 of the antenna 141. The other end of the quarter-wave line 152 is connected to one end of the first switch 153. The other end of the first switch 153 is connected to a high-frequency grounding point (ground).

A second impedance converting circuit 161 includes a quarter-wave line (λ/4 line) 162 and a second switch 163. The quarter-wave line 162 is a transmission line having the equivalent electrical length of a quarter wavelength of a signal frequency. One end of the quarter-wave line 162 is connected to a terminal 143 of the antenna 141. The other end of the quarter-wave line 162 is connected to one end of the second switch 163. The other end of the second switch 163 is connected to a high-frequency grounding point (ground).

A differential input unit 171 includes a balun (transformer) 172 and a differential amplifier 173. The balun can be constructed by using a coupling coil or a coupled line. The illustrated example shows the balun 172 including a coil 175 having two terminals on the output side and a coil 174 having two terminals on the input side. The coils are disposed so that they can be coupled to one another. The two terminals on the output side are connected to one end of the first switch 153 and one end of the second switch 163, respectively. The two terminals on the input side are connected to an output portion of the differential amplifier 173. The differential amplifier 173 receives and amplifies an input differential signal and provides the amplified differential signal to input terminals of the balun 172. It is noted that, similarly to the first embodiment, the balun may be constructed according to the configuration of FIG. 3.

The balun 172 couples the differential signal received at the terminals of the coil 174 to the coil 175. In doing so, the balun 172 directly couples the differential signal received at the input terminals to the coil 175 when the two switches are both open. The differential signal coupled to the coil 175 is output at output terminals of the coil 175, and radiated by the antenna 141 through the impedance converting circuits 151, 161.

On the one hand, when one of the two switches is off, the differential signal input to the balun 172 is transformed into an unbalanced signal. That is, to an output terminal connected to the impedance converting circuit in a high impedance state, a signal having a very small amplitude is provided, and to an output terminal connected to the impedance converting circuit in a low impedance state, a signal having a large amplitude is provided. As the result, to the two terminals 142, 143 of the antenna 141, an unbalanced signal is input through these two impedance converting circuits 152, 162. The input unbalanced signal is radiated in the air as radio waves.

As described above, according to this configuration, a single antenna element can realize the diversity function even though the input signal (transmission signal) is a differential signal.

(Third Embodiment)

A third embodiment is a combination of the first embodiment and the second embodiment.

Figure 10:
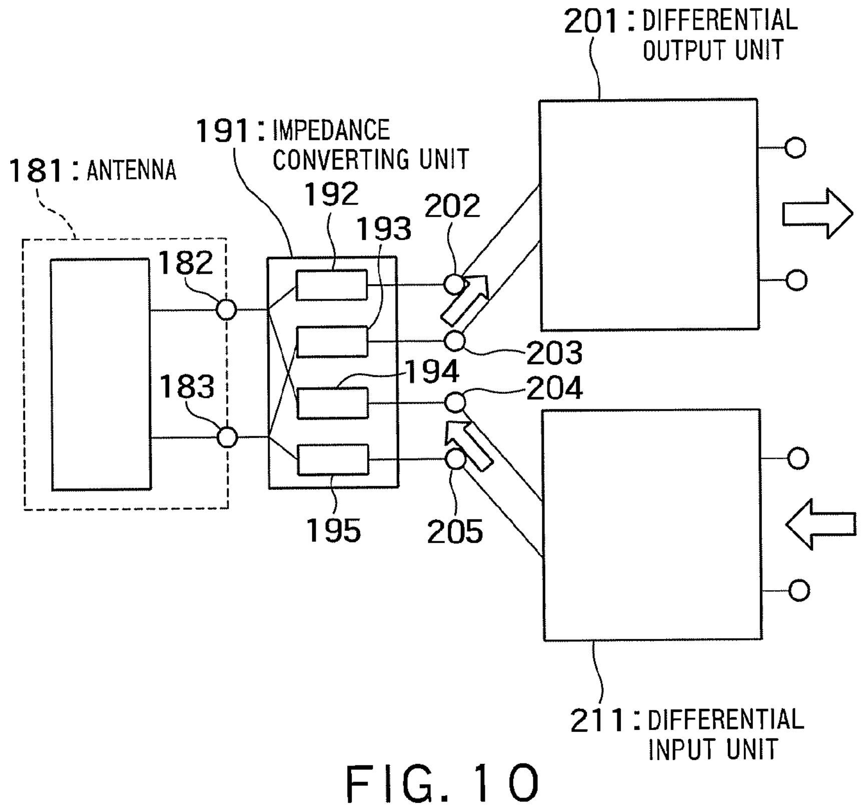
FIG. 10 shows a radio device according to a third embodiment.

FIG. 10 shows a configuration of a radio device (transceiver) according to the third embodiment.

This radio device includes an antenna 181, an impedance converting unit 191, a differential output unit 201 and a differential input unit 211. The antenna 181 includes terminals 182, 183. The antenna 181, the differential output unit 201 and the differential input unit 211 are similar to elements of the first and second embodiment described above having like reference numbers, and description about them will be omitted.

The impedance converting unit 191 includes a first impedance converting circuit 192, a second impedance converting circuit 193, a third impedance converting circuit 194 and a fourth impedance converting circuit 196. Each of the circuits can control its impedance (a first impedance to a fourth impedance).

The first impedance converting circuit 192 is disposed between a terminal 182 of the antenna 181 and an input terminal 202 of the differential output unit 201. The second impedance converting circuit 193 is disposed between a terminal 183 of the antenna 181 and an input terminal 203 of the differential output unit 201.

The third impedance converting circuit 194 is disposed between the terminal 182 of the antenna 181 and an output terminal 204 of the differential input unit 211. The fourth impedance converting circuit 195 is disposed between the terminal 183 of the antenna 181 and an output terminal 205 of the differential input unit 211.

In receiving operation, the third and fourth impedance converting circuit 194, 195 are always set to be in a high impedance state, which accordingly prevents a signal received by the antenna 181 from being input to the differential input unit 211. On the one hand, the first and second impedance converting circuit 192, 193 are both set to be in a low impedance state, or one of them is set to be in a high impedance state, and, accordingly, the diversity is provided and a differential signal or an unbalanced signal is input to the differential output unit 201.

In transmission operation, the first and second impedance converting circuit 192, 193 are set to be in a high impedance state, which accordingly prevents a transmission signal from being input to the differential output unit 201. On the one hand, the third and fourth impedance converting circuit 194, 195 are both set to be in a low impedance state, or one of them is set to be in a high impedance state, and, accordingly, the diversity is provided, and a differential signal or an unbalanced signal is input to the terminals 182, 183 of the antenna 181.

As described above, according to this configuration, a single antenna element can provide the diversity function on receiving, and a differential signal can be output by the differential output unit. Also, on transmission, a single antenna element can realize the diversity function even though the input signal (transmission signal) is a differential signal.

Figure 11:
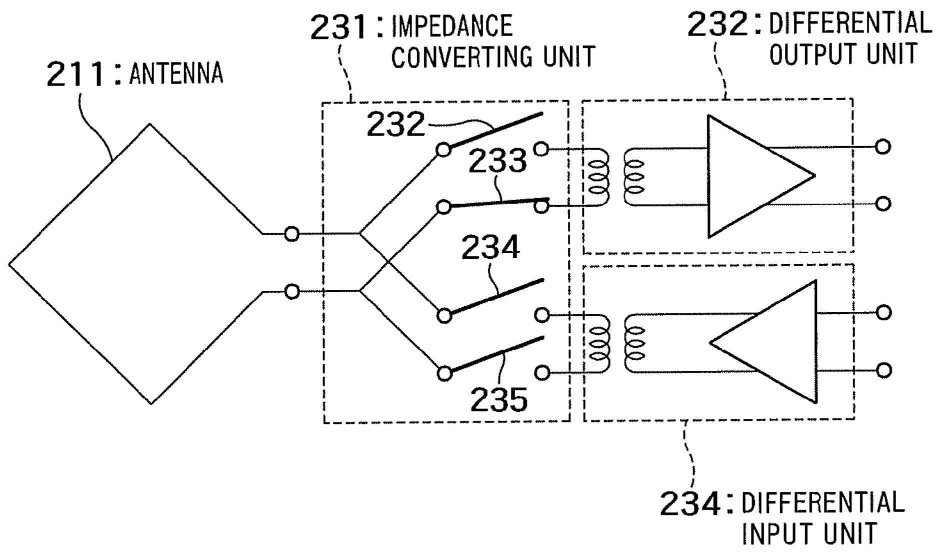
FIG. 11 shows an example of a configuration of the radio device according to the third embodiment.

FIG. 11 shows an example of a configuration of the radio device according to the third embodiment.

This configuration is basically based on a combination of the configuration of the first embodiment shown in FIG. 2 and the configuration of the second embodiment shown in FIG. 11, but a configuration of an impedance converting unit 231 largely differs from the configurations described above (the quarter-wave lines, the switches and the high-frequency grounding point).

An antenna 211 is a loop antenna. A differential output unit 232 is similar to the differential output unit 81 shown in FIG. 2. A differential input unit 234 is similar to the differential input unit 171 shown in FIG. 9. Accordingly, description about them will be omitted.

The impedance converting unit 231 includes a first to fourth impedance converting circuit 232, 233, 234, 235.

Each of the impedance converting circuits includes switches. The antenna is controlled to be connected or disconnected to and from the differential output unit 232 and the differential input unit 234 by short-circuiting or opening the switches. That is, a low impedance state or a high impedance state is set. Accordingly, each of the impedance converting circuits 232 to 235 is in a low impedance state when its switch is short-circuited, and it is in a high impedance state when open.

As described above, according to this configuration, a single antenna element can provide the diversity function on receiving, and a differential signal can be output by the differential output unit. Also, on transmission, a single antenna element can realize the diversity function even though the input signal (transmission signal) is a differential signal.

(Fourth Embodiment)

Figure 12:
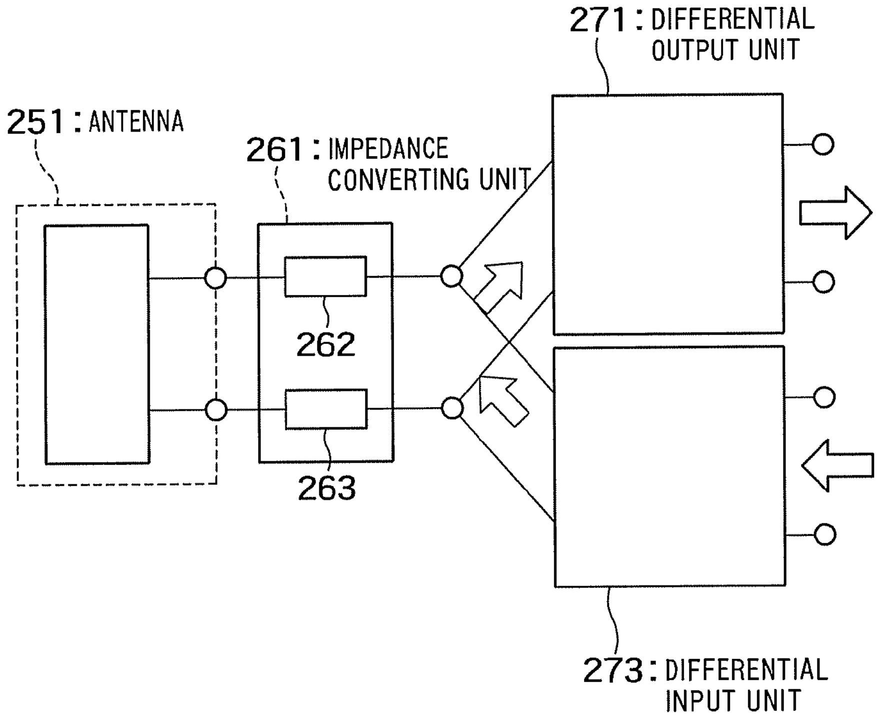
FIG. 12 shows a radio device according to a fourth embodiment.

FIG. 12 shows a configuration of a radio device (transceiver) according to a fourth embodiment.

This radio device includes an antenna 251, an impedance converting unit 261, a differential output unit 271 and a differential input unit 273. The impedance converting unit 261 includes impedance converting circuits 262, 263.

The antenna 251, the impedance converting unit 261, the differential output unit 271 and the differential input unit 273 are basically similar to those of the first and second embodiment described above. A different point lies in that, in receiving operation, the differential output unit 271 is powered on, and the differential input unit 273 is powered off, and, on transmission, conversely, the differential output unit 271 is powered off, and the differential input unit 273 is powered on.

Accordingly, in receiving operation, a signal received by the antenna 251 (differential signal) is provided directly in the form of differential signal or in the form of unbalanced signal to the differential output unit 271 through the impedance converting unit 261. In transmission operation, a transmission signal (differential signal) is provided directly in the form of differential signal or in the form of unbalanced signal to the antenna 251 through the differential input unit 273 and the impedance converting unit 261.

An example of a particular configuration of the impedance converting circuits 262, 263 may be the configuration shown in FIG. 8 (the quarter-wave lines, the switches, the high-frequency grounding point), or the configuration may include only the switches as shown in FIG. 11.

As described above, according to this configuration, a single antenna element can provide the diversity function, and a differential signal can be output by the differential output unit. Also, a single antenna element can realize the diversity function even though the input signal (transmission signal) is a differential signal.

(Fifth Embodiment)

In the Embodiments described above, the impedance of each of the impedance converting circuits is controlled two ways, that is, to be high or low, but in order to improve the diversity function, the impedance can be controlled to take any one of three or more values.

Figure 13:
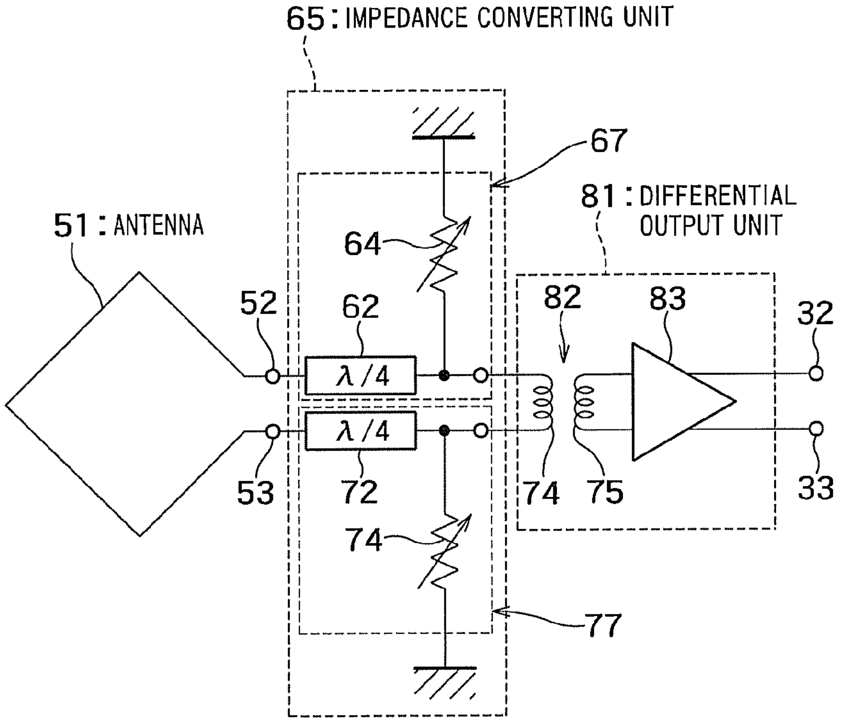
FIG. 13 shows a radio device according to a fifth embodiment.

FIG. 13 shows an example of a configuration of a radio device including an impedance converting circuit whose impedance can be controlled to take any one of three or more values.

An impedance converting unit 65 includes impedance converting circuits 67, 77. An antenna 51 and a differential output unit 81 are similar to those of the first embodiment, as shown in FIG. 2, and description about them will be omitted.

The impedance converting circuit 67 is a circuit in which the switch 63 of the impedance converting circuit 61 shown in FIG. 2 is replaced by a variable impedance element 64 (a variable resistor in the example shown). Similarly, the impedance converting circuit 77 is a circuit in which the switch 73 of the impedance converting circuit 62 shown in FIG. 2 is replaced by a variable impedance element 74 (a variable resistor in an example shown).

In this manner, use of a variable impedance element(s) allows the impedance to be controlled more accurately, and the diversity effect, accordingly, can be enhanced.

A particular configuration of the variable impedance elements 64, 74 may include an optional element, such as a MOSFET or a variable capacitor.

Figure 14:
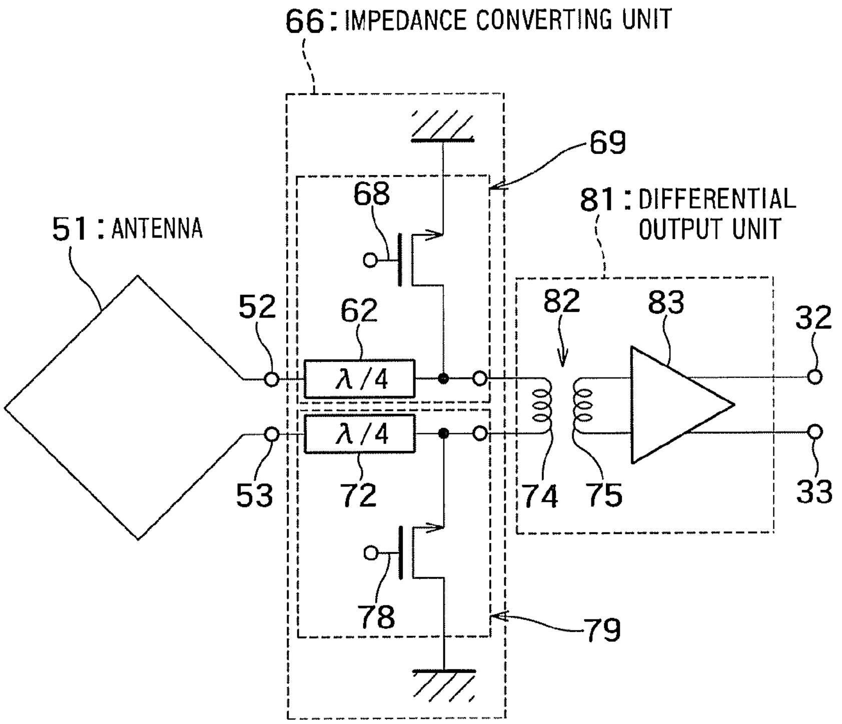
FIG. 14 shows an example of a configuration of the radio device according to the fifth embodiment.

FIG. 14 shows an example of a configuration in which a MOSFET is used.

An impedance converting unit 66 includes impedance converting circuits 69, 79. The impedance converting circuit 69 uses a MOSFET 68 as a variable impedance element. The impedance converting circuit 79 uses a MOSFET 78 as a variable impedance element. In order to set a variable impedance, a phenomenon of a MOSFET is used in which a resistance corresponding to a control voltage is generated between both ends of the MOSFET (between a drain and a source), and by switching this control voltage from 0 (ground) to 1 (supply voltage) in a step-by-step manner, a broad range of impedance can be set.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A radio device comprising:

an antenna having a first terminal and a second terminal to receive a signal by radio:

a first impedance converting circuit and a second impedance converting circuit having a first impedance and a second impedance, respectively, wherein the first impedance and the second impedance are each independently controllable to any one of a plurality of values, and wherein a first end of the first impedance converting circuit and a first end of the second impedance converting circuit are connected to the first terminal and the second terminal of the antenna, respectively;

a differential output unit having a plurality of input terminals respectively connected to a second end of the first impedance converting circuit and a second end of the second impedance converting circuit, wherein the signal received by the antenna is input to the differential output unit at the input terminals thereof through both of the first impedance converting circuit and the second impedance converting circuit, and wherein the differential output unit is configured to transform the signal input to the input terminals thereof into a differential signal;

a first input terminal and a second input terminal to receive a differential signal that is a transmission signal; and a differential input unit having a plurality of third terminals respectively connected to the second end of the first impedance converting circuit and the second end of the second impedance converting circuit, and a plurality of fourth terminals to receive the differential signal from the first input terminal and the second input terminal, wherein the differential input unit is configured to transform the differential signal received from the first input terminal and the second input terminal into an unbalanced signal according to a difference between the first impedance and the second impedance and to output the unbalanced signal to the first impedance converting circuit and the second impedance converting circuit via the third terminals;

wherein the antenna transmits by radio the unbalanced signal input to the first terminal and the second terminal through the first impedance converting unit and the second impedance converting circuit.

2. A radio device comprising:

an antenna having a first terminal and a second terminal;

a first impedance converting circuit and a second impedance converting circuit having a first impedance and a second impedance, respectively, wherein the first impedance and the second impedance are each individually controllable to any one of a plurality of values, and wherein a first end of the first impedance converting circuit and a first end of the second impedance converting circuit are connected to the first terminal and the second terminal, respectively;

a first input terminal and a second input terminal configured to receive a differential signal that is a transmission signal; and a differential input unit having a plurality of third terminals respectively connected to a second end of the first impedance converting circuit and a second end of the second impedance converting circuit, and a plurality of fourth terminals to receive the differential signal from the first input terminal and the second input terminal, wherein the differential input unit is configured to transform the differential signal received from the first input terminal and the second input terminal into an unbalanced signal according to a difference between the first impedance and the second impedance and to output the unbalanced signal to the first impedance converting circuit and the second impedance converting circuit via the third terminals;

wherein the antenna transmits by radio the unbalanced signal input to the first terminal and the second terminal through the first impedance converting unit and the second impedance converting circuit; and wherein a radiation pattern of the antenna is variable by controlling respective values of the first impedance and the second impedance of the first impedance circuit and the second impedance circuit.

* * * * *